United States Patent [19]

Ruetz

[11] Patent Number: 5,005,120
[45] Date of Patent: Apr. 2, 1991

[54] COMPENSATING TIME DELAY IN FILTERING SIGNALS OF MULTI-DIMENSIONAL RECONVIGURABLE ARRAY PROCESSORS

[75] Inventor: Peter A. Ruetz, Redwood City, Calif.

[73] Assignee: LSI Logic Corporation, Milpitas, Calif.

[21] Appl. No.: 226,026

[22] Filed: Jul. 29, 1988

[51] Int. Cl.[5] .................... G06F 3/05; G06F 13/29; G06F 13/372; G06F 15/16
[52] U.S. Cl. ............................... 364/200; 364/231.9; 364/269; 364/271.5; 364/281.9; 364/931.42; 364/945.9; 364/950.4; 364/949.4; 364/232.7; 364/238; 364/247; 364/258; 364/231.8; 364/221.4; 364/229.2; 364/931.01; 364/933.3; 364/937.2; 364/942.0; 364/948.34; 364/949.5; 370/85.1; 370/85.4
[58] Field of Search ............... 364/200, 900; 370/85.4, 370/85.13, 85.1

[56] References Cited

U.S. PATENT DOCUMENTS

| 4,539,679 | 9/1985 | Bux et al. | 370/85.4 |
|---|---|---|---|
| 4,583,088 | 4/1986 | Bux et al. | 370/85.4 |
| 4,627,052 | 12/1986 | Hoare et al. | 370/85.13 |
| 4,670,873 | 6/1987 | Cour et al. | 370/85.13 |
| 4,750,171 | 6/1988 | Kedar et al. | 370/85.1 |
| 4,763,329 | 8/1988 | Green | 371/11 |
| 4,785,394 | 11/1988 | Fischer | 364/200 |
| 4,831,519 | 5/1989 | Morton | 364/200 |
| 4,951,280 | 8/1990 | McCool et al. | 370/85.12 |

Primary Examiner—Archie E. Williams, Jr.
Assistant Examiner—Ayni Mohamed
Attorney, Agent, or Firm—Skjerven, Morrill, MacPherson, Franklin & Friel

[57] ABSTRACT

Apparatus for an array of digital signal processors that can be reconfigured as a one-dimensional or as a two-dimensional array; and method and apparatus for compensating for inconsistent time delays in signals processed by n-dimensional arrays of signal processors.

10 Claims, 7 Drawing Sheets

COMPENSATING TIME DELAY IN FILTERING SIGNALS OF MULTI-DIMENSIONAL RECONVIGURABLE ARRAY PROCESSORS

FIELD OF THE INVENTION

This invention relates to compensation for time delay in filtering of electronic signals in multi-dimensional arrays and to reconfigurable arrays of signal processors.

BACKGROUND OF THE INVENTION

Digital filters are electronic devices that accept a sequence of digital data samples and produce a modified sequence that is a linear combination of previous input data and output data. The data sequence is often obtained from a continuous analog waveform that has been digitized at predetermined (possibly uniform) time intervals. Sampling at uniform time intervals is often used because it simplifies analysis of the system performance. One relationship between the input and output of a digital filter that is often used is $$y_n = \sum_{m=0}^{n} h_m x_{n-m}, \tag{1}$$

where $\{x_m\}$ is the input data sequence, $\{y_n\}$ is the output data sequence and $\{h_m\}$ is a sequence of filter coefficients, sometimes called the impulse response of the filter. When $h_m$ has only a finite number of non-zero terms, the filter is said to have a finite impulse response (FIR filter). Otherwise, the filter is said to have an infinite impulse response (IIR filter). Often, the output data sequence $\{y_n\}$ is written as a linear combination of the input data sequence $\{x_m\}$ and preceding values of the output sequence, viz.

$$y_n = \sum_{m=0}^{n} h_m x_{n-m} + \sum_{k=1}^{n-1} g_k y_{n-k}. \tag{2}$$

A filter of this type is said to be recursive and has infinite impulse response unless all coefficients of the second sum are zero, in which case the filter becomes an FIR filter.

The above remarks apply to one-dimensional filtering in which the data sequence may be related to a single increasing variable such as time. In other situations it is necessary to perform two-dimensional, or more generally n-dimensional, filtering of a data sequence that can only be represented by specification of two or more independent, monotonically increasing or decreasing variables. In this situation, one speaks of doing two-dimensional, or more generally n-dimensional, filtering. An example of such a prescription is the following:

$$y_{m,n} = \sum_{j=0}^{M-1} \sum_{k=0}^{N-1} x_{m-j,n-k} h_{j,k}. \tag{3}$$

With reference to equation 1, if the upper limit M in the sum is finite, the filter is said to have a finite window of length M; this is the maximum length of a string of consecutive non-zero filter coefficients $h_k$. This concept extends easily to two-dimensional or n-dimensional filtering. With reference to equation 3 above, Table 1 indicates the extent of a representative two-dimensional rectangular filter window. In two or more dimensions, a window need not be rectangular in shape, and one occasionally finds those of triangular shape or trapezoidal or other shape in problems encountered in nature. Where two-dimensional, or more generally n-dimensional, filtering is used, one problem encountered is the differing time delays in computation of terms that contribute to the same output term, where processing is distributed over a plurality of processors. The invention disclosed herein provides one technique for handling this problem.

TABLE 1

| 0 | 0 | 0 | 0 | 0 | ... | 0 | 0 |
|---|---|---|---|---|---|---|---|
| 0 | $h_{0,0}$ | $h_{0,1}$ | $h_{1,2}$ | $h_{0,3}$ | ... | $h_{0,N-1}$ | 0 |
| 0 | $h_{1,0}$ | $h_{1,1}$ | $h_{1,2}$ | $h_{1,3}$ | ... | $h_{1,N-1}$ | 0 |
| 0 | $h_{2,0}$ | $h_{2,1}$ | $h_{2,2}$ | $h_{2,3}$ | ... | $h_{2,N-1}$ | 0 |
| 0 |   |   | ... |   |   |   |   |
| 0 | $h_{M-1,0}$ | $h_{M-1,1}$ | $h_{M-1,2}$ | $h_{M-1,3}$ | ... | $h_{M-1,N-1}$ | 0 |
| 0 | 0 | 0 | 0 | 0 | ... | 0 | 0 |
| 0 | 0 | 0 | 0 | 0 | ... | 0 | 0 |

In another embodiment, the invention provides apparatus for a digital signal processor array that can be reconfigured as a one-dimensional or as a two-dimensional array.

SUMMARY OF THE INVENTION

The goals of the invention disclosed herein may be realized in one embodiment by providing an associated time delay T, for each clocked shift register in a two-dimensional array of such registers connected to a processor, that is expressible as $T = \tau_1 + m \cdot \tau_2$, where $\tau_1$ and $\tau_2$ are fixed, predetermined time intervals and the multiplier m is a non-negative integer that may be different for different processors in the array. All delay times are integral multiples of the clock cycle time.

The goals of the invention may be realized in another embodiment by providing an array of two or more rows of shift registers (or simple sub-processors), with each row of registers being connected together serially end-to-end, with each row of registers receiving an externally generated input signal, and with each row of registers feeding a signal processor, where an output signal from a first row of registers is routed to a multiplexer or similar programmable means that also receives an externally-generated signal and an output signal of this multiplexer is fed to a second row of processors.

DETAILED DESCRIPTION

Figure 1:
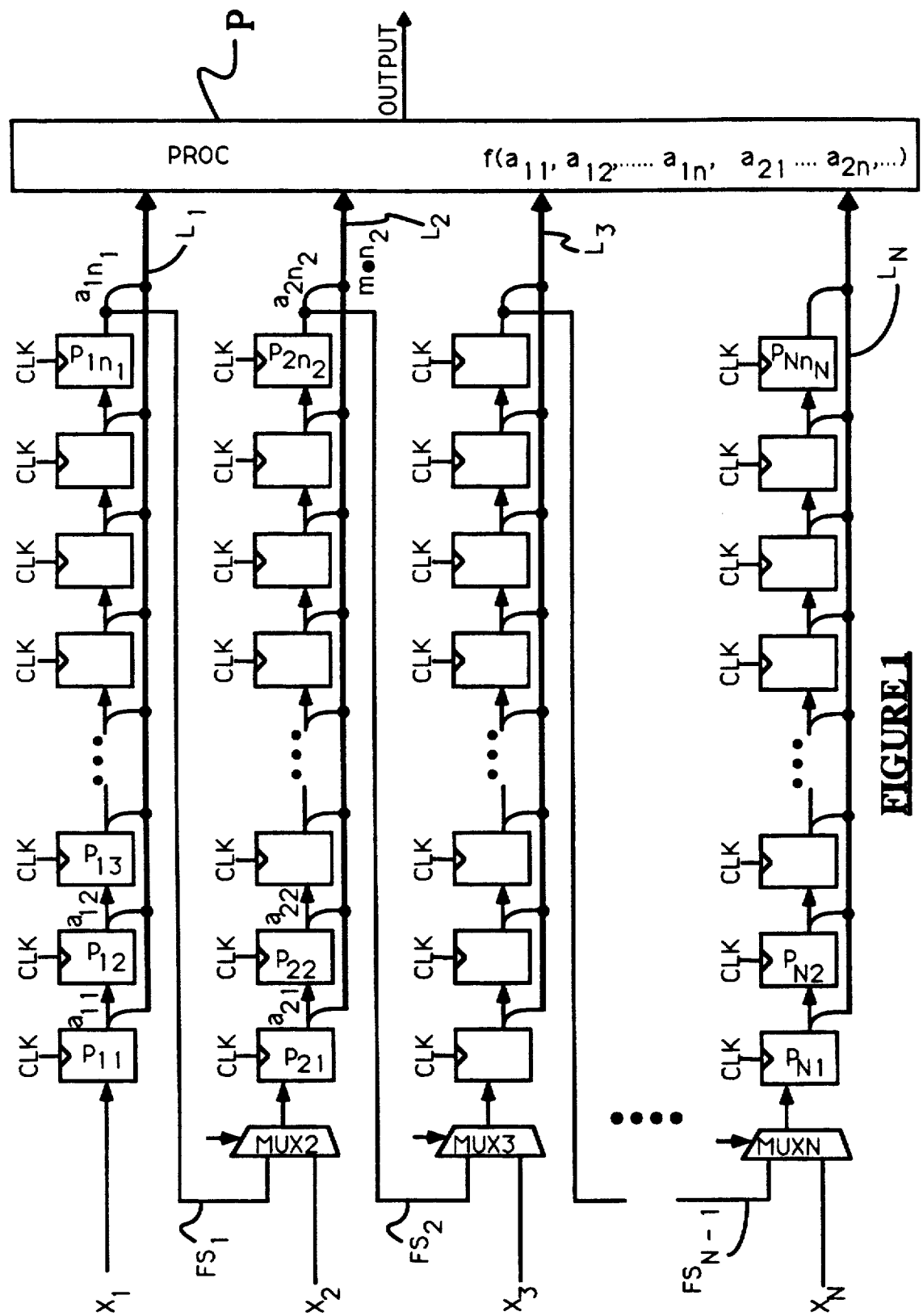
FIG. 1 is a schematic view of a reconfigurable digital signal processor that may be used as a one-dimensional or as a two-dimensional filter or other processor.

In digital signal processing, an array of clocked registers holds preceding values of the input data to be processed. The shape of the array of registers determines the filter window shape. To obtain the desired window shape, the configuration of the register array must be set by the user before filtering commences. FIG. 1 illustrates one approach to two-dimensional filtering, wherein a series $x_1, \ldots, x_N$ of data sequences arrives at a series of N designated rows of clocked shift registers. The data sequence $x_1$ arrives at the first row of registers, consisting of the clock-driven shift registers $P_{11}, P_{12}, \ldots P_{1n_1}$ with the output terminal of $P_{ij}$ connected to the input terminal of $P_{i,j+1}$ ($j=1,2,\ldots, n_1-1$); and in a similar manner the data sequence denoted $x_{k(2<k<N)}$ arrives at the $k^{th}$ row of registers as shown. The data sequence $x_1$ is processed serially by the $n_1$ registers in the first row, and the resulting signal is passed to a processor P and is also fed back as feedback signal $FS_1$ to a multiplexer MUX2 that also receives the data sequence $x_2$. The multiplexer MUX2, as well as the other multiplexers shown, MUX3, ..., MUXN, may be statically programmed or may be dynamically programmed, depending upon the filtering application. The (omnibus) processor P performs general processing operations that are common to the output signals that issue from all registers $P_{kj}$ ($j=1,2,\ldots, n_k$, $k=1,\ldots, N$) in each row.

Figure 8:
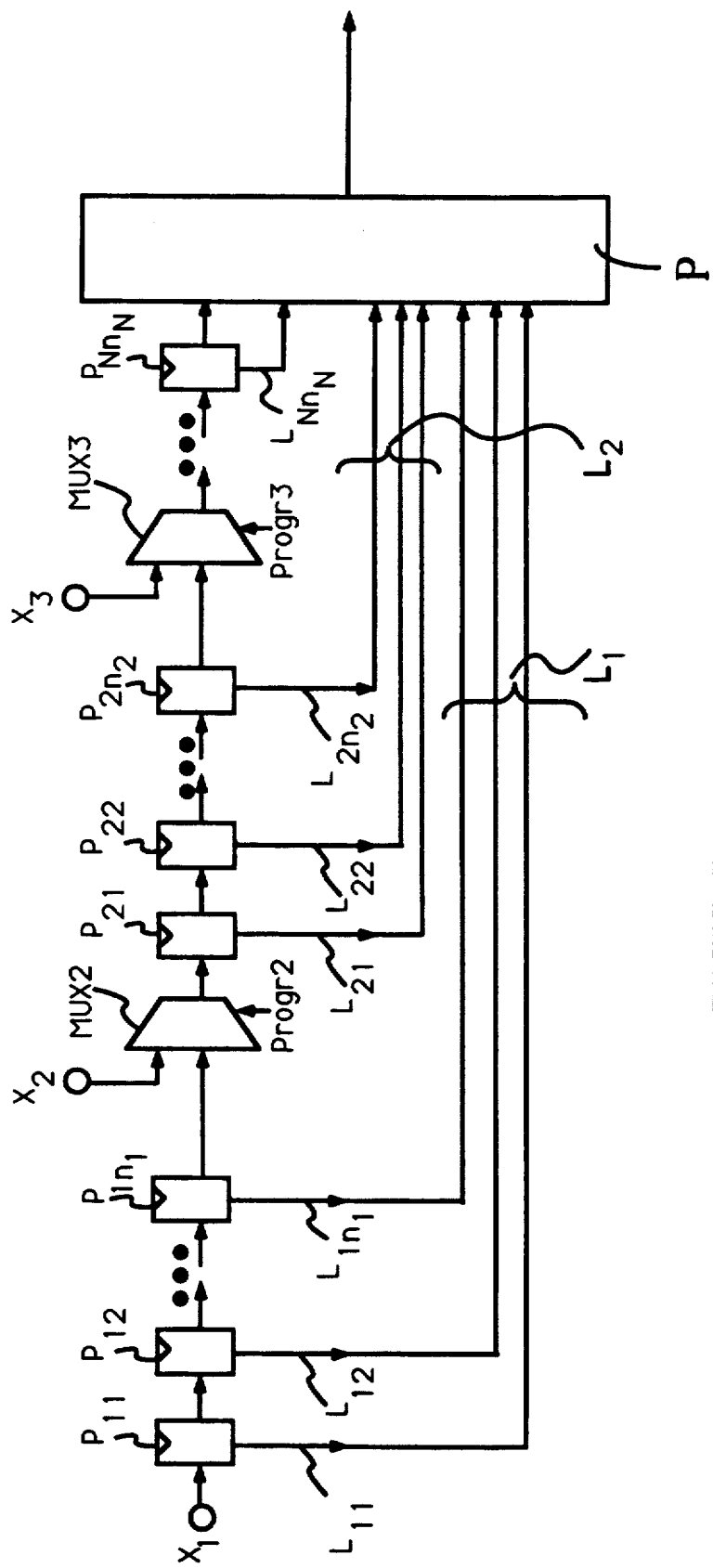
FIG. 8 is a schematic illustration of the array in FIG. 1, reconfigured as a one dimensional array with input taps at each multiplexer.

Each register $P_{ij}$ shown in FIG. 1 may be an n-bit shift register, with the main processing being performed by the processor P. Alternatively, each register $P_{ij}$ may perform some other processing steps (called a "sub-processor" herein). The n-bit content of each register in row k ($1<k<N$) may also be deposited on a collective line $L_k$ at each clock cycle for delivery to the processor P, as shown in FIG. 8. The collective line $L_k$ may be a collection of $n \cdot n_k$ parallel lines, with each of these parallel lines carrying information on the current value of one bit in one of the registers $P_{kj}$ ($1<j<n_k$).

One of the signal sequences $FS_1$ or $x_2$ is passed through the multiplexer MUX2 and becomes the data input sequence for the second row of registers $P_{21}, P_{22}, \ldots P_{2n_2}$. In a similar manner, the signal sequences $FS_2, \ldots FS_{N-1}$ are generated and passed to the processor P and are simultaneously fed back to the corresponding multiplexers MUX3, ..., MUXN that stand at the beginning of each row of registers $k=1,2,\ldots, N$. In this manner, the array shown in FIG. 1 may be operated as a linear shift register of length $n_1+n_2+\ldots+n_N$, by arranging for each of the multiplexers MUX2, ..., MUXN to accept only the feedback signal and not the combinatorial or direct input signal. Alternatively, one can operate the array as a two-dimensional array or filter by allowing one or more of the multiplexers MUX2, ..., MUXN to accept one of the direct inputs from an external signal so that the arriving data sequences are to some extent processed in parallel by the omnibus processor P. The processing array shown in FIG. 1 is advantageous for two-dimensional signal processing at high data rates because it avoids the problem of transport of multiline data over a single bus; if multiline data were multiplexed over a single bus this would require very high input/output data rates, and this would limit the rate at which data could be processed. For example, in order to multiplex 32 20 MHz input signals on a single package pin, the required input/output delay times could be no more than about 1.56 nsec (640 MHz), which is difficult to consistently achieve.

For purposes of this description, a "reconfigurable signal processor" is an arrangement of two or more rows of signal processors, each row having at least two signal processors therein, where a signal that is received by a first processor in a row of processors passes serially through each processor in that row, from the first processor in that row to a last processor in that row, and where a processor in each of at least two rows of signal processors accepts an externally generated signal (not generated by any processor in the array) as an input signal for that processor. The array illustrated in FIG. 1 is a "reconfigurable signal processor," according to this definition, if one of the multiplexers MUX2, ..., MUXN accepts an externally generated signal and passes this signal to a processor in that row.

Figure 2:
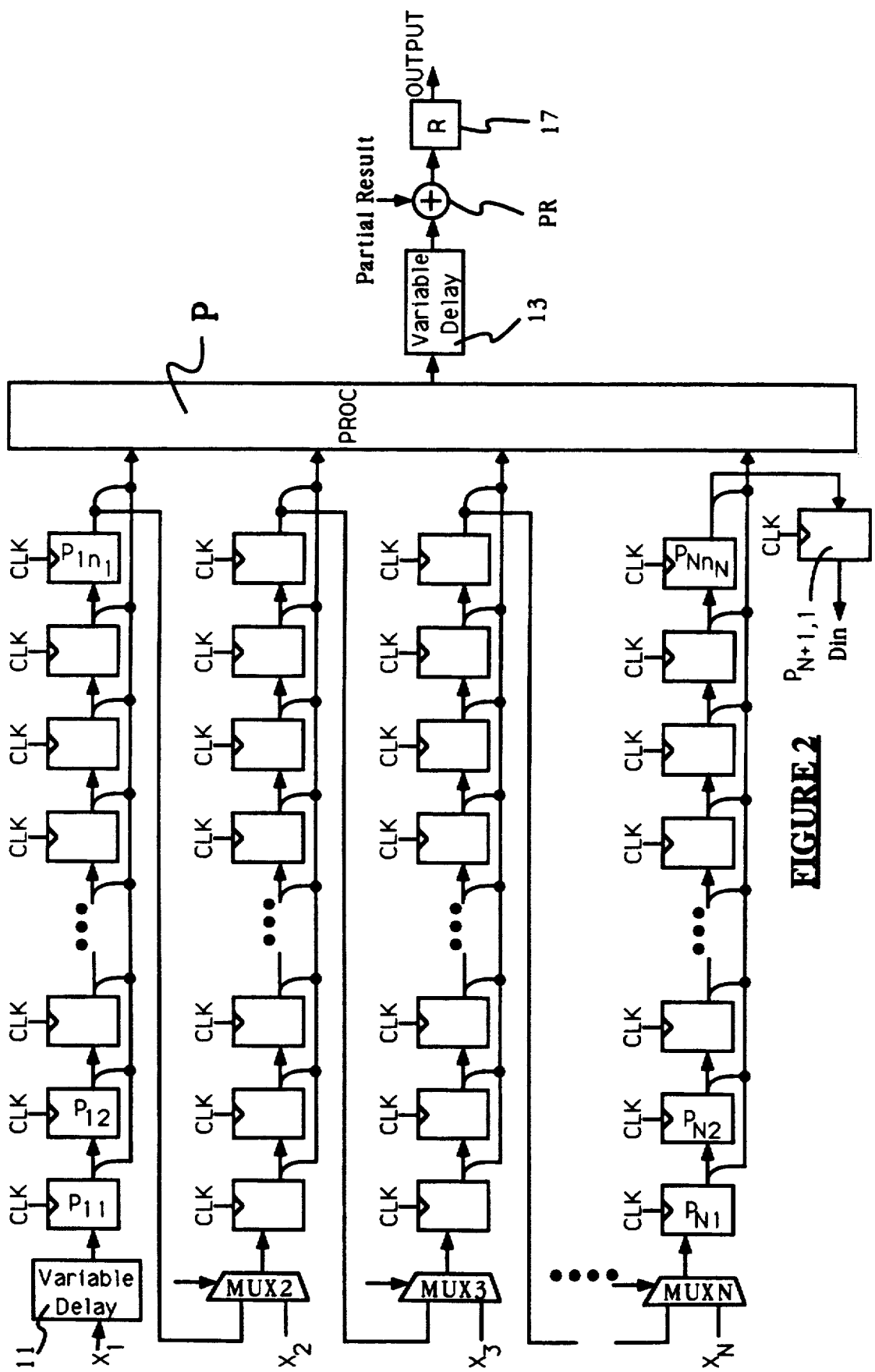
FIG. 2 is a schematic view of a reconfigurable digital signal processor with expansion capability.

FIG. 2 illustrates an expandable version of the reconfigurable processor array shown in FIG. 1. A variable time delay unit 11 may be optionally inserted adjacent to the input terminal of the first register in the first row of registers; a second variable time delay unit 13 may be optionally inserted to receive the data issuing from the processor P; a summer or adder PR is included to sum any incoming partial results with the current result; and a pipeline register 17 may be added after the adder or summer. The variable time delay units allow compensation for the skew in time introduced by the pipeline register 17. In linear filtering, delaying the input signal to the filter is equivalent to delaying the output signal from the filter. The variable time delay unit 11 positioned at the input is used to compensate for delays when the system operates as a one-dimensional filter, where only the input data sequence $x_1$ is accepted by the array; and the variable time delay unit 13 positioned at the processor output terminal compensates for delays, where the array is used as a two-dimensional filter and two or more data sequences $x_i$ and $x_j$ ($i \neq j$) are received by rows i and j. The entire array shown in FIG. 2 functions as a signal processor, and these processors may be connected together to increase filter window width, or increase precision, or both.

The array illustrated in FIG. 1 or FIG. 2 may be generalized in the following manner: (1) feedback of a signal $FS_1$, may occur from the output terminal of any register $P_{1k}$ ($1<k<n_1$) in the first row of registers, with an analogous extension to the other feedback signals $FS_q$ ($2<q<N$); and (2) each multiplexer $MUX_q$ ($2<q<N$) may receive feedback signals $FS_r$ ($2<r<N$) from any number of the rows of register and may receive one or more of the external data sequence signals available (denoted $x_1, \ldots, x_N$ in FIGS. 1 and 2).

In FIG. 2, the signal that issues from register $P_{Nn_N}$ may also be fed to another register, denoted $P_{N+1,1}$ and the results thereof may be routed to an input terminal of another register (not shown in FIG. 2) that is part of a different array (not shown in FIG. 2). The output terminal of the register $P_{N+1,1}$ corresponds to the shift register output SRO shown for each processor Q in FIG. 3 or FIG. 4. The variable time delay unit 11 and the "output" register $P_{N+1,1}$ in FIG. 2 will generally appear together; this occurs where only a single data sequence (e.g., $x_1$) is received by the array. Where two or more data sequences $x_i$ and $x_j$ are received by the array, the variable time delay unit 11 and the "output" register $P_{N+1,1}$ would be removed and a variable time delay unit 13 would be inserted before the partial result adder PR shown in FIG. 2; alternatively, the time delay unit 13 could be inserted on each collective line $L_k$ (k=1,2, ..., N) before the signals on these lines are received by the processor P.

Figure 3:
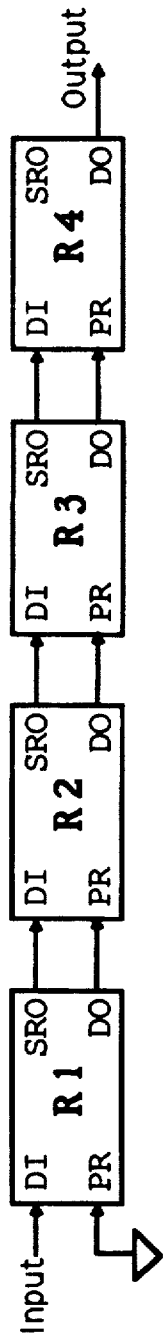
FIG. 3 is a schematic illustration of one-dimensional array processing of a one-dimensional input signal, using one embodiment of the invention.

FIG. 3 illustrates a 1×4 array of processors R, where R denotes the entire array shown in FIG. 2. In this arrangement, a single input signal arrives at data input terminal DI of processor R1, is processed by R1, and is fed to a partial result input terminal PR of processor R2 through a data output terminal DO of processor R1. A shift register output terminal SRO of processor R1 (corresponds to register $P_{N+1,1}$ in FIG. 2) is connected to a data input terminal D1 of processor R2. This pattern is repeated for transfer of the processed information from processor R2 to processor R3, and from processor R3 to processor R4, as illustrated in FIG. 3. Only the data input terminal DO of the last processor in the row (here R4) issues an output signal; any signal issued by the shift register output SRO, if any, of the last processor in the row may be ignored. In this arrangement, no net time delay occurs between the signal that arrives at data input terminal DI of processor Rk (k=2, 3, ...) and the signal that arrives at partial result input terminal PR of processor Rk. FIG. 3 illustrates a one-dimensional array of processors, used to process a one-dimensional signal; this is useful where both the data word and any multiplication coefficients, for example as in Eq. (1), are expressible as 8-bit words.

Figure 4:
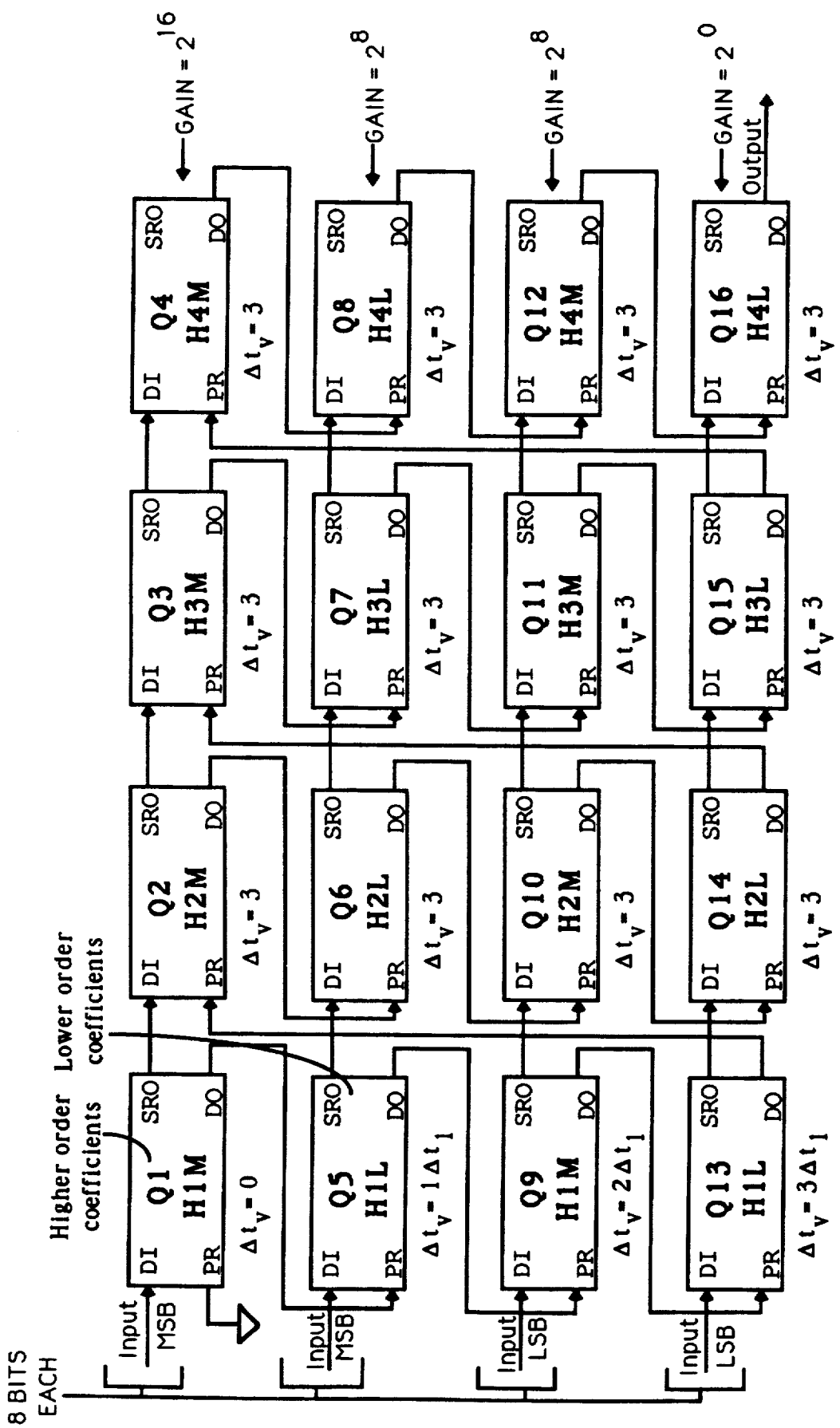
FIGS. 4 and 7 are schematic illustrations of one technique for increasing both window size and precision for digital signal processing of 16-bit data and 24-bit data, respectively, using the invention. These views illustrate two-dimensional array processing of a one-dimensional signal.

FIG. 4 illustrates a 4×4 array of processors Q, used to process data words that are expressible as pairs of 8-bit bytes, where Q denotes the entire array shown in FIG. 2. Each processor Q1, Q2, Q3, ... Q16 shown in FIG. 3 has a variable time delay unit (with time delay magnitude $\Delta t_\nu$) associated with it, and it is assumed that the inter-terminal delay in transferring a signal to a line connecting one processor to the next processor (e.g., from Q13 to Q2 or from Q6 to Q7) is the same time interval $\Delta t_1$. Processors Q1, Q5, Q9 and Q13 receive external inputs of 16-bit data words, with Q1 and Q5 receiving the same highest magnitude eight bits (MSB) and Q9 and Q13 receiving the eight bits of lowest magnitude (LSB). It is useful to express a 16-bit data word D as the sum of the eight MSB bits $D_M$ and the eight LSB bits $D_L$, as indicated in Equation 4.

$$D = D_M + D_L \quad (4)$$
$$D_M = (d_{15}, d_{14}, \ldots d_9, d_8, 0, 0, \ldots 0, 0),$$
$$D_L = (0, 0, \ldots, 0, 0, d_7, d_6, \ldots, d_1, d_0).$$

The data word D is to be multiplied by a numerical coefficient word $C=C_M+C_L$, where this coefficient is also decomposed into the sum of the eight MSB bits $C_M$ and the eight LSB bits $C_L$ in a manner analogous to that illustrated in Equation 4. The product of the numerical coefficient C and the data word D is now written as a sum of four individual product terms as illustrated in Equation 5 below, where the first product term $C_M \cdot D_M$ represents the highest magnitude component; the two components $C_L \cdot D_M$ and $C_M \cdot D_L$ are reduced in magnitude by a multiplicative or "gain" factor of $2^8$; and the fourth term $C_L \cdot D_L$ is reduced in magnitude by a multiplicative or "gain" factor of $2^{16}$ relative to the first term $C_M \cdot D_M$.

$$C \cdot D = C_M \cdot D_M + C_L \cdot D_M + C_M \cdot D_L + C_L \cdot D_L \quad (5)$$

The coefficient component $C_M$ is associated with processors Q1–Q4 and Q9–Q12; and the coefficient component $C_L$ is associated with processors Q5–Q8 and Q13–Q16. The data word component $D_M$ is received by each of the processors Q1 and Q5; and the data word component $D_L$ is received by each of the processors Q9 and Q13. Thus, processors Q1, Q5, Q9 and Q13 may be considered to produce the respective product term components $C_M \cdot C_M$, $C_L \cdot D_M$, $C_M \cdot D_L$ and $C_L \cdot D_L$. A data word component $D_M$ is received, for example, at the data input terminal DI of processor Q1 and is processed therein. A partial result of this processing is issued at the data output terminal DO of Q1 and is passed to the partial result input terminal PR of processor Q5 for combined processing with the data word component $D_M$ received at the data input terminal DI of Q5. A second data output terminal, denoted SRO, of processor Q1 functions as a shift register output and passes a time delayed version of the data input signal received by Q1 to a data input terminal DI of processor Q2. In effect, the shift register of Q1 is joined to the shift register of Q2; this yields a filter of increased filter window width. In a similar manner, a time delayed version of the data input signal received by processor may be passed in chain link fashion by the output terminal SRO of Q2 to processors Q3 and Q4 in that order; and the information produced in Q4 is then fed in chain link fashion to processors Q8, Q12 and Q16 in that column. Similarly, the partial result information received at the partial result input terminal PR of processor Q5 may be passed through the data output terminal DO in chain link fashion to processors Q9 and Q13 in that order.

Processing of data over a window of width larger than can be accommodated by a single processor can be performed by horizontally connecting a sequence of processors in one row or in a series of rows as shown in FIG. 3. The result of connecting a row of k processors together is that the output signal $y_n$ becomes a sum of sums of the data input signals that are indicated in Eq. (1), for example $$y_n = \sum_{j=0}^{k-1} \sum_{m=0}^{N-1} h_{m+j \cdot n} x_{n-m-j \cdot n-D}, \quad (6)$$

where D represents a parasitic delay that is characteristic of the array of processors used.

Ultimately, all data word information that is fed to processors Q1, Q5, Q9 and Q13 is processed by the array of processors shown in FIG. 4, and the desired final result appears at the output terminal DO of processor Q16, with the various paths for flow of information indicated in FIG. 4. The number of columns of processors Q in FIG. 4 is not restricted to four; any number of columns ma be included therein, with the number of such columns determining the window size. FIG. 4 illustrates two-dimensional array processing of a one-dimensional signal, a single sequence of data words D.

One problem encountered here is the fact that the inter-terminal delay associated with a path such as Q1-Q2-Q3-Q4-Q8-Q12-Q16 may be substantially different from the inter-terminal delay associated with another path such as Q1-Q2-Q3-Q7-Q11-Q15-Q4-Q8-Q12-Q16 with the same end points. If the time differences for inter-terminal delay are not compensated, the final output signal $y_n$ will contain partial results computed at many different times rather than at a single time as desired. One solution here is to add differing time delays at the individual processors Qk that will provide the needed compensation so that the time delay from input o output is constant for all paths with the same end points.

Another embodiment of the invention disclosed here provides a method of compensating for what would otherwise be a difference in accumulated inter-terminal delays, using a variable time delay that is associated with each of the processors shown in FIG. 4. The variable time delays $\Delta t_v$ that are built into each of the processors Q1, Q2, ..., Q16 are indicated below each of the processors shown in FIG. 4. Processors Q1, Q5, Q9 and Q13 have respective associated variable time delays of zero, $\Delta t_1$, $2\Delta t_1$, and $3\Delta t_1$; the variable time delays associated with all other processors in the array are $3\Delta t_1$ each, where $\Delta t_1$ may be the length of a clock period or multiple thereof. One verifies after some computation that the accumulated transfer delay of two different paths that begin at any processor $Q_n$ ($1 < n < 15$) and end at processor Q16 are the same. For example, one verifies that the cumulative time delay for each of four paths that begin at the Q5 input terminal and end at the Q16 output terminal is equal to $16\Delta t$: (1) Q5-Q6-Q7-Q8-Q12-Q16; (2) Q5-Q6-Q7-Q11-Q15-Q4-Q8-Q1-Q16; and (3) Q5-Q6-Q10-Q14-Q3-Q7-Q11-Q15-Q4-Q8-Q12-Q16; and (4) Q5-Q9-Q13-Q2-Q6-Q10-Q14-Q3-Q7-Q11-Q15-Q4-Q8-Q12-Q16. This general equality of accumulated time delay for fixed endpoints is easily verified for any path beginning at processor Qn ($1 < n < 15$) and ending at processor Q16. More generally, a total time delay $\tau = \tau_1 + M \cdot \tau_2$ may be built into each of a series of such processors Q, where $\tau_1$ and $\tau_2$ are fixed and predetermined and the non-negative integer M is chosen separately for each processor to compensate for time delay differences.

Figure 5:
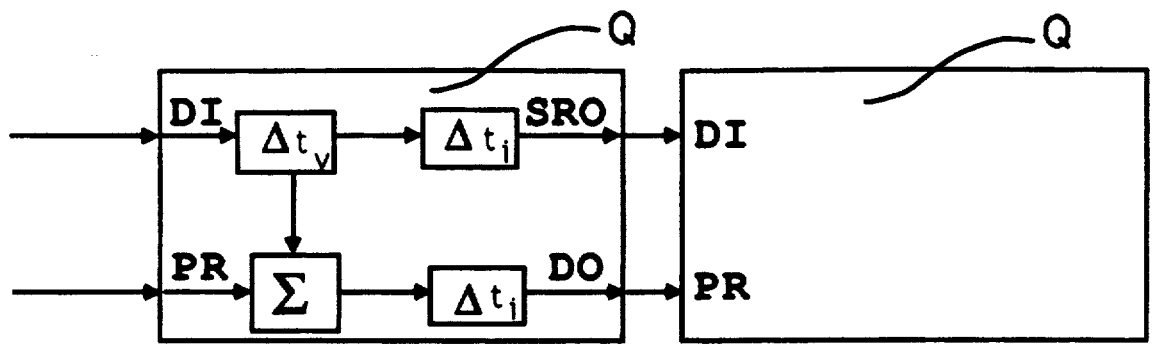
FIG. 5 is a schematic view illustrating the signal propagation time delay that is introduced for different paths within one of the processors shown in FIGS. 3, 4, 6 or 7.

FIG. 5 illustrates schematically the time delay associated with the different input signals and output signals ed to or issuing from a processor Q in FIG. 4. If an input signal enters the processor at direct input terminal DI, a time delay $\Delta t_v$, which may vary from one processor Q to another, is introduced in signal propagation within Q. This signal may proceed from the variable time delay unit to the shift register output terminal RO; one additional fixed time delay $\Delta t_1$ in signal propagation is introduced adjacent to this output terminal, corresponding to inter-processor propagation delay. Alternatively, the signal that enters the processor Q at input terminal DI may proceed from the variable time delay unit to the direct output terminal DO; one additional fixed time delay $\Delta t_1$, corresponding to inter-processor propagation delay, is also introduced here; this mode is normally used only in the last processor (for example, Q16 in FIG. 4) in a chain of processors. As another alternative, an input signal may enter the processor Q at the partial result input terminal PR and proceed directly to the direct output terminal DO; this signal encounters only the inter-processor propagation time delay $\Delta t_1$ as discussed above. Thus, the total time delay T for passage from an input terminal of one processor Q to the input terminal of a processor Q that directly receives a signal from Q is determined as follows:

$DI - SRO - DI: T = \Delta t_v + \Delta t_1,$
$DI - DO - PR: T = \Delta t_v + \Delta t_1,$
$PR - DO - PR: T = \Delta t_1.$ With these determinations of total time delays, one easily verifies that the total time delay associated with any two paths with the same pair of end points in FIG. 4 is the same.

Figure 6:
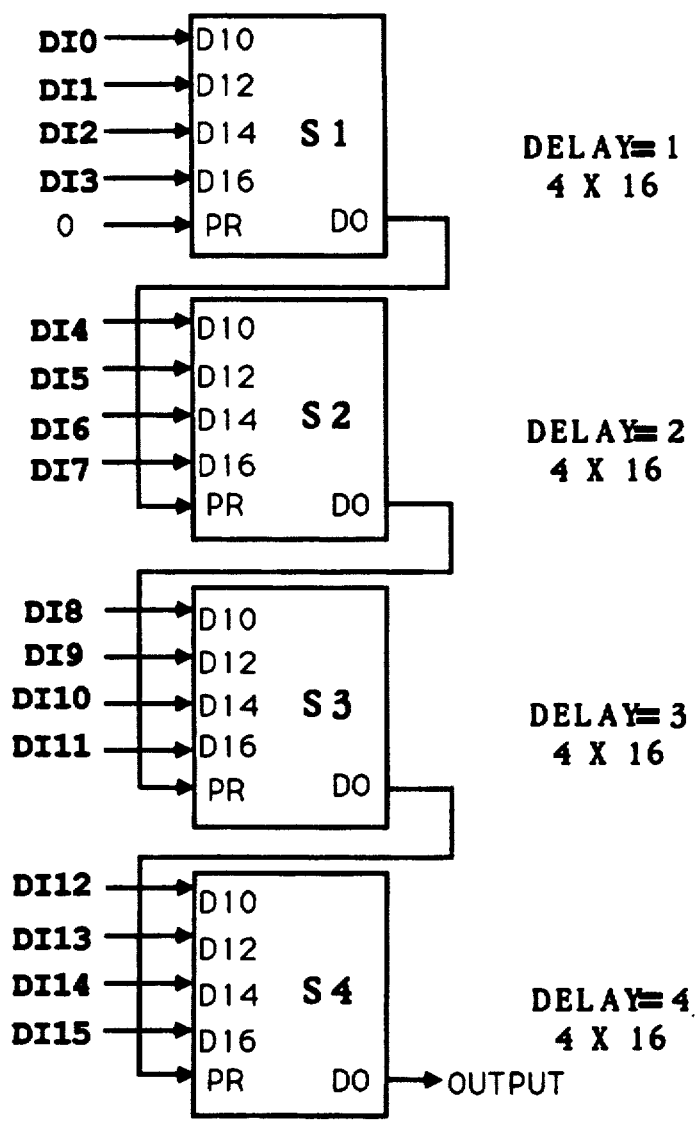
FIG. 6 is a schematic illustration of one-dimensional array processing of a two-dimensional signal, using one embodiment of the invention.

FIG. 6 illustrates a $4 \times 1$ array of processors S, where S denotes the entire array in FIG. 2. FIG. 6 illustrates one-dimensional processing of a two-dimensional signal. The partial result signal path DO→PR runs from one processor to the next processor as before. The input terminal time delay and shift register output terminal time delay indicated in FIG. 2 cannot be used here as those delays are included in only one of the data input terminal lines DIk (k=0, 1, 2, ..., 15). The output terminal time delay unit (13 in FIG. 2) is used for filters, such as shown in FIG. 5, where more than one input signal is processed in each processor. Here, four input signals are fed to each processor. With the time delays $\Delta t_v$ associated with each processor S1, S2, S3 and S4 as shown in FIG. 6, relative time delays of the signals received at the data input terminals DIx and at the partial result input terminals PR are compensated for, in the sense discussed in connection with FIG. 4. If the arrangement in FIG. 6 is expanded or contracted from four such processors to m such processors, variable time delays of $\Delta t_v = \Delta t_1, \Delta t_2, \ldots, m\Delta t_1$ must be provided at the processor output terminals to compensate for the relative time delays differences. The arrangement shown in FIG. 6 is a two-dimensional array of processors for processing a one-dimensional signal.

Figure 7:
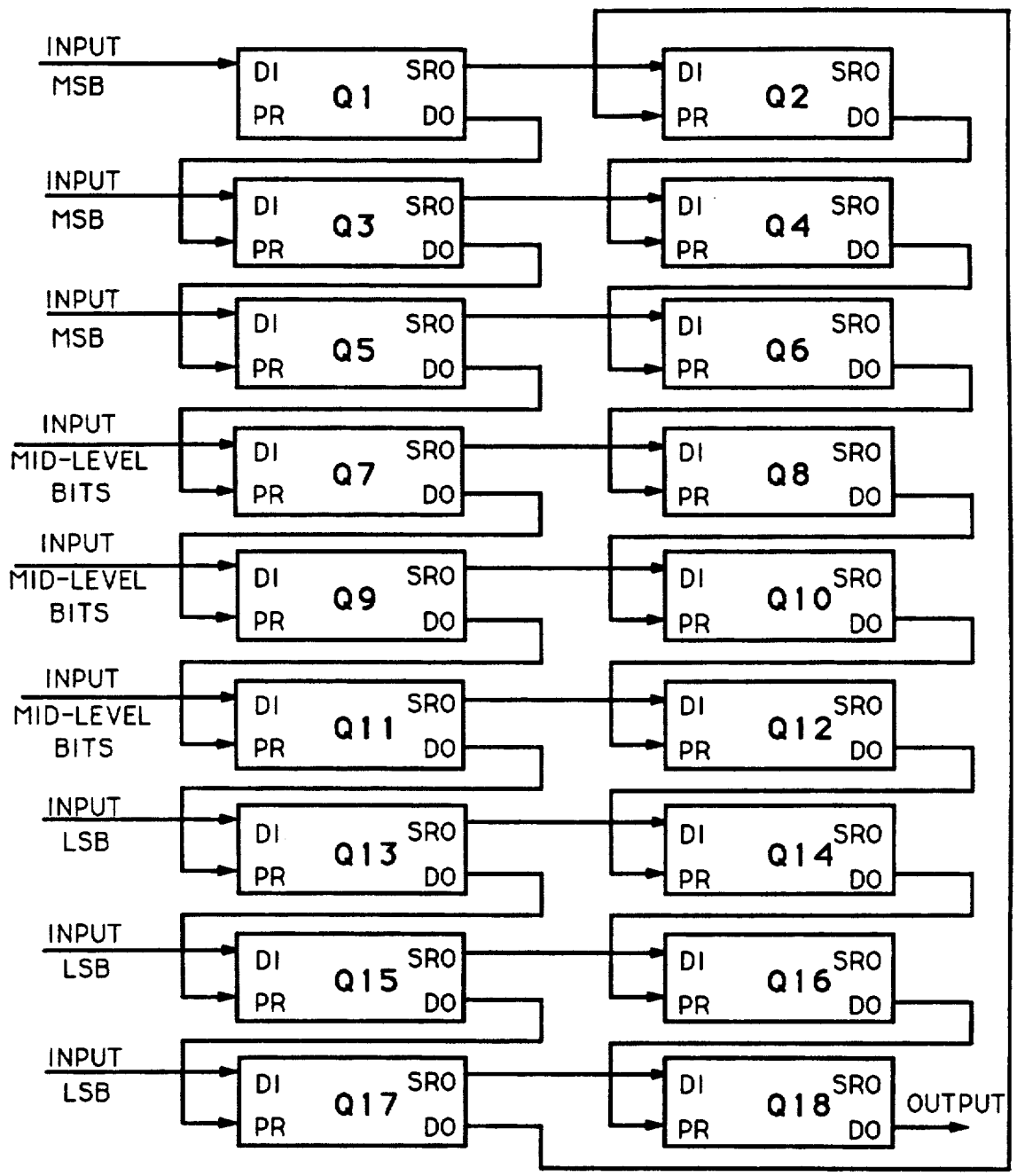

This result can be extended to filtering or other linear digital signal processing of 24-bit data by adopting a $9 \times M$ array ($M \geq 2$) and the associated time delays such as the $9 \times 2$ array of processors Q1, Q2, ..., Q18 shown in FIG. 7. In FIG. 7, the first three rows each receive the eight MSBs; the last three rows each receive the eight LSBs; and the three middle rows (4,5,6) each receive the eight mid-level level bits (bits 8,9, ..., 15 in a 24-bit word). With reference to FIGS. 3 or 5, if one works with data words and coefficient words that are expressed as 8K bits (K = 1, 2, 3, ...), the analog of the arrays shown in FIGS. 4 or 7 will have $K^2$ rows. The number of processors in any row is arbitrary and is set by the particular window width requirements of the signal processing to be performed.

The array of shift registers $P_{ij}$ and processor P shown in FIG. 1 is illustrated as a two-dimensional array. In practice, this array of shift registers $P_{ij}$ and processor P are more conveniently arranged in a linear sequence of registers $P_{11}, P_{12}, \ldots, P_{1n1}, P_{21}, P_{22}, \ldots$, as shown in FIG. 8, with a multiplexer MUX2 inserted between registers $P_{1n1}$ and $P_{21}$, and more generally a multiplexer MUXk ($2 \leq k \leq N$) inserted between registers $P_{k-1,nk-1}$ and $P_{k1}$. The multiplexer MUXk receives an input signal at a first input terminal from the register $P_{k-1,nk-1}$, receives an externally generated signal $x_k$ at a second input terminal, and receives a programming input signal Progrk at a programming input terminal of the multiplexer ($2 \leq k \leq N$). The registers $P_{k1}, P_{k2}, \ldots, P_{knk}$ each have an input terminal to receive an input signal from $x_1$ or from the multiplexer MUXk or from the preceding register in the sequence; each such register has a first output terminal to issue an output signal for receipt by the multiplexer MUX(k+1) or by the processor P or by the succeeding register in the sequence; and each such register $P_{ij}$ has a second output terminal connected by a line $L_{ij}$ directly to the processor P. Each line $L_{ij}$ may be a collection of r individual signal lines, one for each position in the register $P_{ij}$, so that the number of such individual signal lines received by the processor P is $$\sum_{k=1}^{N} r \cdot n_k.$$

Although the invention has been shown and described in one or more preferred embodiments herein, variation and modification of the invention may be made without departing from the scope of the invention.

I claim:

1. A reconfigurable signal processing module comprising:
   a first module input port (X.1) for receiving a first digital signal stream (A.1=$a_{1,1}\ a_{1,2}\ldots a_{1,n.1}$) having sequential data components ($a_{1,1}\ a_{1,2}\ldots a_{1,n.1}$) representing a first number n.1>1 of sample values;
   a second module input port (X.2) for receiving a second digital signal stream (A.2=$a_{2,1}\ a_{2,2}\ldots a_{2,n.2}$) having sequential data components ($a_{2,1}\ a_{2,2}\ldots a_{2,n.2}$) representing a second number n.2>1 of sample values;
   a first chain of register means ($P_{1,1}\ P_{1,2}\ldots P_{1,n.1}$), having a first end coupled to the first module input port (X.1), for receiving and storing the data components ($a_{1,1}\ a_{1,2}\ldots a_{1,n.1}$) of the first digital signal stream (A.1) and for outputting predesignated stored ones of said data components ($a_{1,1}\ a_{1,2}\ldots a_{1,n.1}$) in parallel onto a corresponding number of first-chain tap lines;
   first multiplexer means, having first and second selectable multiplexer input ports and a first multiplexer output port, for outputting signals appearing on a selected one of the first and second multiplexer input ports, the first multiplexer input port being coupled to a preselected one or more of the first-chain tap lines and the second multiplexer input port being coupled to the second module input port (X.2);
   a second chain of register means ($P_{2,1}\ P_{2,2}\ldots P_{2,n.2}$), having a first end coupled to the first multiplexer output port, for receiving and storing, during a first mode of the first multiplexer means, each of the data components ($a_{2,1}\ a_{2,2}\ldots a_{2,n.2}$) of the second digital signal stream (A.2) and for outputting predesignated ones of said data components ($a_{2,1}\ a_{2,2}\ldots a_{2,n.2}$) in parallel onto a corresponding number of second-chain tap lines, the second chain of register means being further for receiving and storing, during a second mode of the first multiplexer means, a plurality of first-chain-stored data components transmitted from the preselected one or more first-chain tap lines and for outputting predesignated ones of said first-chain-stored data components in parallel onto a corresponding number of second-chain tap lines, the first mode of the first multiplexer means being one in which the first multiplexer input port is coupled to the first multiplexer output port, the second mode of the first multiplexer means being one in which the second multiplexer input port is coupled to the first multiplexer output port; and
   function generating means, having function input lines coupled to predetermined ones of the first-chain and second-chain tap lines, for receiving as input parameter signals of a predetermined signal processing function, preselected ones of the shifted data components ($a_{1,1},\ a_{1,2},\ldots,\ a_{1,n.1}$ and $a_{2,1},\ a_{2,2},\ldots\ a_{2,n.2}$) and for outputting on a function output bus of the function generating means, a digital function signal which is produced according to said signal processing function.

2. A reconfigurable signal processing module according to claim 1 wherein the digital function signal represents a weighted sum of the sample values represented by signals received at the function input lines of the function generating means.

3. A reconfigurable signal processing module according to claim 2 further comprising:
   a partial result input port for receiving a partial result signal representing a partial result value generated by an external signal processing module; and
   partial result summing means having a first summation input port coupled to the function output bus of the function generating means and a second summation input port coupled to the partial result input port, the partial result summing means being for summing the weighted sum represented by the digital function signal with the partial result value of the partial result signal, the partial result summing means further having a result output port for outputting a summed result signal representative of the values summed by the partial result summing means.

4. A reconfigurable signal processing module according to claim 3 further comprising:
   a module result output port (DO); and
   a pipeline register (R) having a register input port coupled to the result output port and a register output port coupled to the module result output port.

5. A reconfigurable signal processing module according to claim 4 further comprising:
   a module shift register output port (SRO); and
   a pipeline compensating register ($P_{N+1,1}$) having an input port coupled to a second end of the second chain of register means and an output port coupled to the module shift register output port (SRO), the compensating register ($P_{N+1,1}$) having a time delay equal to the time delay of the pipeline register (R).

6. A reconfigurable signal processing module according to claim 5 further comprising front end variable delay means interposed between the first module input port (X.1) and the first serial chain of register means ($P_{1,1}\ P_{1,2}\ldots P_{1,N.1}$), for delaying by a predetermined time duration ($\Delta t_v$) the transmission of the first digital signal stream (A.1) from the first module input port (X.1) to the first end of the first chain of register means.

7. A first reconfigurable signal processing module according to claim 4 in combination with a second reconfigurable signal processing module according to claim 4, the module result output port (DO) of the first module being coupled to one of the first and second module input ports (X.1 or X.2) of the second module.

8. A reconfigurable signal processing module according to claim 3 further comprising back end variable delay means, interposed between the function output bus and the first summation input port, for delaying the digital function signal so that the delayed digital function signal is synchronized with the partial result signal.

9. A reconfigurable signal processing module according to claim 1 further comprising:
   a third module input port (X.3) for receiving a third digital signal stream (A.3=$a_{3,1}\ a_{3,2}\ldots a_{3,n.3}$) having sequential data components ($a_{3,1}\ a_{3,2}\ldots a_{3,n.3}$) representing a third number n.3>1 of sample values;

a third chain of register means ($P_{3,1}$ $P_{3,1}$ ... $P_{3,n.3}$) having a first end coupled to the third module input port (X.3), for receiving and storing each of the data components ($a_{3,1}$ $a_{3,2}$ ... $a_{3,n.3}$) of the third digital signal stream (A.3) and for outputting predesignated stored ones of said data components ($a_{3,1}$ $a_{3,2}$ ... $a_{3,n.3}$) in parallel onto a corresponding number of third-chain tap lines; and second multiplexer means having third and fourth selectable multiplexer input ports and a second multiplexer output port for outputting signals appearing on a selected one of the third and fourth multiplexer input ports, the third multiplexer input port being coupled to a preselected one or more of the second-chain tap lines and the fourth multiplexer input port being coupled to the third module input port (X.3).

10. A digital signal processing module comprising:

first and second module input ports for receiving serial data signals generated outside the module;

first and second tapped shift register means, each shift register means having an input end, an output end and a series of data storing means interposed between its input and output ends for shifting and storing data signals received at its input end, where the input end of the first shift register means is coupled to the first module input port;

multiplexer means having a first multiplexer input port coupled to the output end of the first tapped shift register means, a second multiplexer input port coupled to the second module input port and a multiplexer output port coupled to the input end of the second tapped shift register means for selectively coupling the input end of the second tapped shift register means to one of the multiplexer input ports;

wherein each of said first and second shift register means has tap points provided at output sides of its data storing means for outputting signals representative of the data stored therein;

where the module further includes processor means coupled to the tap points of the first and second tapped shift register means for processing the signals output therefrom;

wherein said processor means has a processor output port for outputting a result signal which is a function of the signals produced at the tap points of the first and second shift register means; and where the module further includes:

result combining means for combining said result signal with a partial result signal generated externally of said module; and pipeline register means, coupled to an output port of the result combining means, for temporarily storing a combined result signal produced by the result combining means.

* * * * *